(12) United States Patent
Huang et al.

(10) Patent No.: US 12,557,475 B2
(45) Date of Patent: Feb. 17, 2026

(54) DISPLAY PANEL AND DISPLAY APPARATUS (71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Yongchao Huang, Beijing (CN); Qinghe Wang Wang, Beijing (CN); Leilei Cheng, Beijing (CN); Tongshang Su, Beijing (CN); Jun Liu, Beijing (CN); Chao Wang, Beijing (CN); Jun Cheng, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 573 days.

(21) Appl. No.: 17/914,516

(22) PCT Filed: Nov. 22, 2021

(86) PCT No.: PCT/CN2021/132197
§ 371 (c)(1),
(2) Date: Sep. 26, 2022

(87) PCT Pub. No.: WO2022/199081
PCT Pub. Date: Sep. 29, 2022

(65) Prior Publication Data
US 2024/0389383 A1 Nov. 21, 2024

(30) Foreign Application Priority Data

Mar. 23, 2021 (CN) .......................... 202110308898.9

(51) Int. Cl.
*H10K 59/121* (2023.01)
*H10K 59/131* (2023.01)
*H10K 59/80* (2023.01)

(52) U.S. Cl.
CPC ..... *H10K 59/1213* (2023.02); *H10K 59/1216* (2023.02); *H10K 59/131* (2023.02); *H10K 59/8792* (2023.02)

(58) Field of Classification Search
CPC ............ H10K 59/1213; H10K 59/131; H10K 59/1216; H10K 59/8792
(Continued)

(56) References Cited

U.S. PATENT DOCUMENTS

2017/0125506 A1* 5/2017 Kim ..................... H10K 59/126
2018/0061908 A1* 3/2018 Shim .................... H10K 59/351
(Continued)

FOREIGN PATENT DOCUMENTS

CN 108206010 A 6/2018
CN 110190091 A 8/2019
(Continued)

OTHER PUBLICATIONS

First Office Action for Chinese Patent Application No. 202110308898.9 issued by the Chinese Patent Office on Apr. 29, 2022.
(Continued)

*Primary Examiner* — Steven S Paik
(74) *Attorney, Agent, or Firm* — XSENSUS LLP (57) ABSTRACT

A display panel includes a base substrate, and pixel driving circuits disposed on the base substrate. A pixel driving circuit in the pixel driving circuits includes a driving transistor and a capacitor. A gate of the driving transistor is farther from the base substrate than an active layer of the driving transistor. An active portion of the active layer includes edges that are flush with respective edges of the
(Continued)

gate. A first electrode plate of the capacitor is coupled to the gate of the driving transistor. A second electrode plate of the capacitor is disposed on a side of the gate away from the base substrate, and is able to shield light. Orthographic projections, on the base substrate, of the edges of the active portion that are flush with respective edges of the gate are located within an orthographic projection of the second electrode plate on the base substrate.

17 Claims, 7 Drawing Sheets

(58) Field of Classification Search
 USPC .......................................................... 257/40
 See application file for complete search history.

(56) References Cited

U.S. PATENT DOCUMENTS

| | | |
|---|---|---|
| 2018/0175077 A1 | 6/2018 | Koo et al. |
| 2019/0164999 A1 | 5/2019 | Choi |
| 2019/0189723 A1* | 6/2019 | Kim .................. G09G 3/3233 |
| 2019/0214447 A1* | 7/2019 | Kim .................. H10K 59/1216 |
| 2020/0294446 A1 | 9/2020 | Long |
| 2021/0183313 A1 | 6/2021 | Dong et al. |
| 2021/0202633 A1* | 7/2021 | Song .................... G09G 5/00 |
| 2021/0202659 A1* | 7/2021 | Lee ...................... H10K 71/60 |
| 2021/0359279 A1 | 11/2021 | Cai |
| 2022/0102461 A1 | 3/2022 | Yuan et al. |
| 2022/0320211 A1 | 10/2022 | Zhao et al. |
| 2022/0320219 A1 | 10/2022 | Zheng |

FOREIGN PATENT DOCUMENTS

| | | |
|---|---|---|
| CN | 111180491 A | 5/2020 |
| CN | 111276499 A | 6/2020 |
| CN | 111341814 A | 6/2020 |
| CN | 210984240 U | 7/2020 |
| CN | 111834465 A | 10/2020 |
| CN | 111863837 A | 10/2020 |
| CN | 112259595 A | 1/2021 |
| CN | 113066804 A | 7/2021 |
| KR | 20150097856 A | 8/2015 |

OTHER PUBLICATIONS

Second Office Action for Chinese Patent Application No. 202110308898.9 issued by the Chinese Patent Office on Oct. 20, 2022.

Supplementary Search Report for Chinese Patent Application No. 202110308898.9 issued by the Chinese Patent Office on Jan. 13, 2023.

* cited by examiner

DISPLAY PANEL AND DISPLAY APPARATUS

CROSS-REFERENCE TO RELATED APPLICATIONS

This application is a national phase entry under 35 USC 371 of International Patent Application No. PCT/CN 2021/132197 filed on Nov. 22, 2021, which claims priority to Chinese Patent Application No. 202110308898.9, filed on Mar. 23, 2021, which are incorporated herein by reference in their entirety.

TECHNICAL FIELD

The present disclosure relates to the field of display technologies, and in particular, to a display panel and a display apparatus.

BACKGROUND

Due to advantages of self-luminescence, lightness and thinness, low power consumption, good color rendition, sensitive response and wide viewing angle, self-luminous display apparatuses such as organic light-emitting diode (OLED) display apparatuses have been increasingly widely used in display devices, such as mobile phones, notebook computers and televisions, and become a mainstream of the current market.

SUMMARY

In an aspect, a display panel is provided. The display panel includes a base substrate, and pixel driving circuits disposed on the base substrate. A pixel driving circuit in the pixel driving circuits includes a driving transistor and a capacitor. The driving transistor includes a gate and an active layer, and the active layer of the driving transistor includes an active portion, a first conductive portion and a second conductive portion. The gate is farther from the base substrate than the active layer. The active portion includes edges that are flush with respective edges of the gate. The capacitor includes a first electrode plate and a second electrode plate arranged opposite to each other in a thickness direction of the base substrate. The first electrode plate is coupled to the gate of the driving transistor. The second electrode plate is disposed on a side of the gate away from the base substrate, and is able to shield light. Orthographic projections, on the base substrate, of the edges of the active portion that are flush with respective edges of the gate are located within an orthographic projection of the second electrode plate on the base substrate.

In some embodiments, an orthographic projection of the active portion of the driving transistor on the base substrate is located within the orthographic projection of the second electrode plate on the base substrate. Alternatively, an opening is provided in the second electrode plate, the second electrode plate has an inner edge and an outer edge, and an edge of the opening constitutes the inner edge of the second electrode plate. The orthographic projections, on the base substrate, of the edges of the active portion of the driving transistor that are flush with respective edges of the gate are located between an orthographic projection of the outer edge of the second electrode plate on the base substrate and an orthographic projection of the inner edge of the second electrode plate on the base substrate.

In some embodiments, the driving transistor further includes a first conductive pattern. The first conductive portion of the driving transistor has a first contact portion, and the second conductive portion of the driving transistor has a second contact portion. The first contact portion is in contact with the first conductive pattern, and the second contact portion is in contact with the second electrode plate.

In some embodiments, the first conductive pattern is arranged in a same layer as the second electrode plate. The first contact portion is farther from the active portion than the second contact portion.

In some embodiments, the pixel driving circuit further includes a first switching transistor. The first switching transistor includes an active layer, and the active layer of the first switching transistor includes an active portion, a first conductive portion and a second conductive portion. The first conductive portion of the first switching transistor is used for receiving a reset signal or providing a sensing signal, and the second conductive portion of the first switching transistor is coupled to the second electrode plate.

In some embodiments, the pixel driving circuit further includes a light-shielding metal layer disposed on a side of the active layer of the driving transistor proximate to the base substrate. An orthographic projection of the active portion of the driving transistor on the base substrate is located within an orthographic projection of the light-shielding metal layer on the base substrate, and the light-shielding metal layer is coupled to the second electrode plate.

In some embodiments, in a case where the pixel driving circuit further includes the first switching transistor, the pixel driving circuit further includes a second conductive pattern. The second conductive portion of the first switching transistor has a third contact portion, and the third contact portion is in contact with the second conductive pattern. The second electrode plate and the second conductive pattern are connected into an integral structure; or the orthographic projection of the second electrode plate on the base substrate is spaced apart from an orthographic projection of the second conductive pattern on the base substrate, and the second conductive pattern and the second electrode plate are coupled to the light-shielding metal layer.

In some embodiments, the active layer of the first switching transistor is arranged in a same layer as the active layer of the driving transistor, and the second conductive pattern is arranged in a same layer as the second electrode plate. The pixel driving circuit further includes a first insulating layer disposed between the active layer of the first switching transistor and the second conductive pattern, and a second insulating layer disposed between the active layer of the first switching transistor and the light-shielding metal layer. A first via is provided in the first insulating layer, and a second via is provided in the second insulating layer. An orthogonal projection of the first via on the base substrate is overlapped with an orthogonal projection of the second via on the base substrate. The second conductive pattern is in contact with the third contact portion through the first via, and the light-shielding metal layer is coupled to the third contact portion through the second via.

In some embodiments, the second conductive pattern is opposite to the second electrode plate in a first direction and a second direction. The first direction and the second direction are two directions that are parallel to a plane where the base substrate is located and perpendicular to each other.

In some embodiments, the first electrode plate is arranged in a same layer as the active layer, and an orthographic projection of the first electrode plate on the base substrate is overlapped with the orthographic projection of the second electrode plate on the base substrate.

In some embodiments, the pixel driving circuit further includes a second switching transistor. The second switching transistor includes an active layer, and the active layer of the second switching transistor includes an active portion, a first conductive portion and a second conductive portion. The first conductive portion of the second switching transistor is used for receiving a data signal, and the second conductive portion of the second switching transistor is coupled to the gate of the driving transistor.

In some embodiments, the display panel further includes a power line disposed on the base substrate. The first conductive portion of the driving transistor in the pixel driving circuit is coupled to the power line.

In some embodiments, in a case where the driving transistor further includes the first conductive pattern, the power line is arranged in a same layer as the first conductive pattern, and the power line is in contact with the first conductive pattern.

In some embodiments, in a case where the pixel driving circuit further includes the light-shielding metal layer, the pixel driving circuit further includes a third conductive pattern arranged in a same layer as the light-shielding metal layer, and the third conductive pattern is coupled to the first conductive portion of the driving transistor and the power line.

In some embodiments, the display panel further includes a sensing signal line disposed on the base substrate. The first conductive portion of the first switching transistor is coupled to the sensing signal line.

In some embodiments, the pixel driving circuit further includes a fourth conductive pattern arranged in the same layer as the light-shielding metal layer, and the fourth conductive pattern is coupled to the first conductive portion of the first switching transistor and the sensing signal line.

In some embodiments, the display panel further includes light-emitting devices disposed on the base substrate and respectively coupled to the pixel driving circuits. Light emitted from the light-emitting devices exits from a side of the light-emitting devices away from the base substrate.

In another aspect, a display apparatus is provided. The display apparatus includes the display panel as described above.

In some embodiments, the display panel further includes a data line disposed on the base substrate. The first conductive portion of the second switching transistor is coupled to the data line.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic designations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

In addition, the use of the phrase "based on" means openness and inclusiveness, since a process, step, calculation or other action that is "based on" one or more stated conditions or values may, in practice, be based on additional conditions or values exceeding those stated.

As used herein, the term such as "about" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

As used herein, a "first electrode" is, for example, a source of a thin film transistor, and a "second electrode" is, for example, a drain of the thin film transistor, and vice versa.

As used herein, the same reference numeral may denote a signal line and a signal terminal, and may also denote signals respectively corresponding to the signal line and the signal terminal.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus. The display apparatus may be, for example, one of an organic light-emitting diode (OLED) display apparatus, a quantum dot light-emitting diode (QLED) display apparatus, a micro light-emitting diode (Micro LED) display apparatus, and a mini light-emitting diode (Mini LED) display apparatus.

Hereinafter, a structure of the display apparatus will be described in an example where the display apparatus is the OLED display apparatus.

Figure 1:
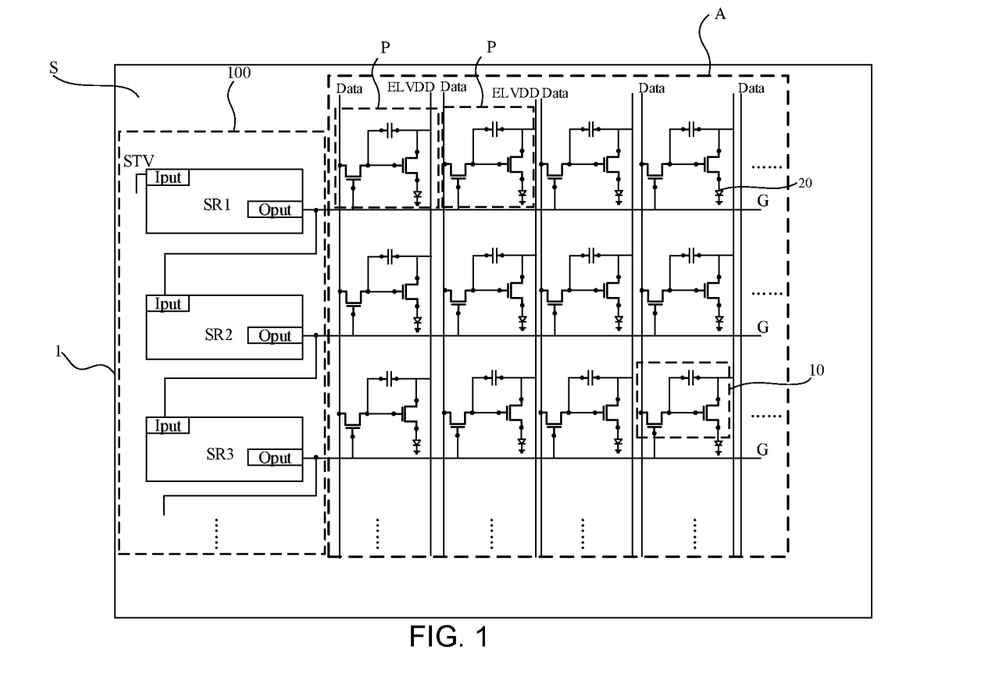
FIG. 1 is a top view of a display panel, in accordance with some embodiments.

The display apparatus includes, for example, a display panel. As shown in FIG. 1, the display panel has a display area A and a peripheral area S disposed on a periphery of the display area A. The display area A includes a plurality of sub-pixel regions P. The peripheral area S is used for wiring, such as for providing a gate driving circuit 100.

In some embodiments, referring to FIG. 1 again, the display panel includes a base substrate 1, pixel driving circuits 10 disposed on the base substrate 1 and respectively located in the sub-pixel regions P, and light-emitting devices 20 respectively coupled to the pixel driving circuits 10. The gate driving circuit 100 is connected to the pixel driving circuits 10. The light-emitting device 20 emits light under a drive of the pixel driving circuit 10.

The pixel driving circuit 10 may be, for example, a 2T1C type pixel driving circuit, a 3T1C type pixel driving circuit, or a 7T1C type pixel driving circuit. Here, T represents a thin film transistor (TFT), and C represents a capacitor. The 2T1C type pixel driving circuit represents a pixel driving circuit 10 including two TFTs and one capacitor Cst, and so on.

In any type pixel driving circuit 10 described above, a TFT, especially a metal oxide semiconductor TFT, is degraded in TFT device characteristics under illumination conditions. In addition, TFT device transfer characteristics have an obvious negative drift under negative gate bias stress (NBS) in illumination, i.e., under negative gate bias illumination stress (NBIS), which is embodied as a negative drift of a threshold voltage (Vth) under NBIS. Therefore, it is particularly important to improve a stability of the threshold voltage of the TFT under NBIS.

Figure 2:
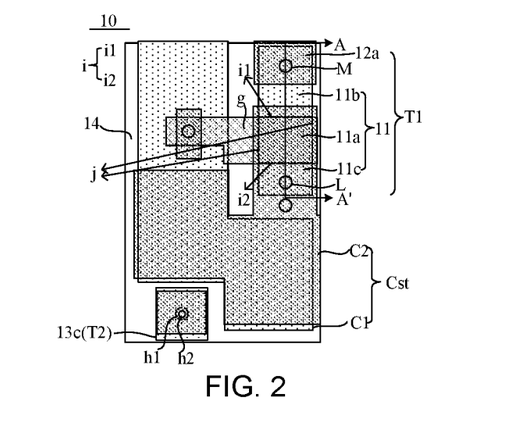
FIG. 2 is a top view of a pixel driving circuit, in accordance with some embodiments.

In some embodiments, as shown in FIG. 2, the pixel driving circuit 10 includes a driving transistor T1 and a capacitor Cst. The driving transistor T1 includes a gate g and an active layer 11. The active layer 11 of the driving transistor T1 includes an active portion 11a, a first conductive portion 11b and a second conductive portion 11c. The gate g is farther from the base substrate 1 than the active layer 11, and the active portion 11a includes edges i that are flush with respective edges of the gate g. That is, the driving transistor T1 is a top-gate transistor. The active portion 11a forms a channel region (which refers to an overlapping region of the active layer 11 and the gate g). The active portion 11a may be made of a metal semiconductor material, such as indium gallium zinc oxide (IGZO). The first conductive portion 11b and the second conductive portion 11c may be made of a material obtained by conducting IGZO, and are respectively a source portion and a drain portion of the driving transistor T1 (as shown in FIG. 2, the source portion and the drain portion are portions respectively located on two sides of the active portion 11a).

The capacitor Cst includes a first electrode plate C1 and a second electrode plate C2 arranged opposite to each other in a thickness direction c of the base substrate 1. The first electrode plate C1 is coupled to the gate g of the driving transistor T1. The second electrode plate C2 is disposed on a side of the gate g away from the base substrate 1, and is able to shield light. Orthographic projections, on the base substrate 1, of the edges i of the active portion 11a that are flush with respective edges of the gate g are located within an orthographic projection of the second electrode plate C2 on the base substrate 1.

The orthographic projections, on the base substrate 1, of the edges i of the active portion 11a that are flush with respective edges of the gate g are located within the orthographic projection of the second electrode plate C2 on the base substrate 1, which means that the orthographic projections, on the base substrate 1, of the edges i of the active portion 11a that are flush with respective edges of the gate g are overlapped with the orthographic projection of the second electrode plate C2 on the base substrate 1, and are spaced apart from an orthographic projection of an edge of the second electrode plate C2 on the base substrate 1.

Since the active portion 11a is a portion of the active layer 11 having the overlapping region with the gate g, it can be known that the active portion 11a may include two parts of edges, a first part of edges are flush with respective edges of the gate g, and a second part of edges j are flush with respective edges of the active layer 11.

The first part of edges of the active portion 11a that are flush with respective edges of the gate g are the edges i of the active portion 11a that are flush with respective edges of the gate g. As shown in FIG. 2, the edges i of the active portion 11a that are flush with respective edges of the gate g may include an upper edge i1 and a lower edge i2. In this way, the orthographic projections, on the base substrate 1, of the edges i of the active portion 11a that are flush with respective edges of the gate g are located within the orthographic projection of the second electrode C2 on the base substrate 1, which means that orthographic projections of the upper edge i1 and the lower edge i2 on the base substrate 1 are located within the orthographic projection of the second electrode plate C2 on the base substrate 1.

Figure 4:
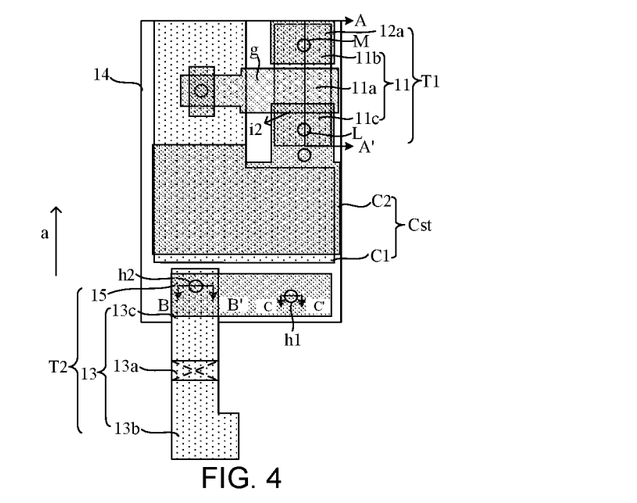
FIG. 4 is a top view of a pixel driving circuit in the related art.
Figure 5:
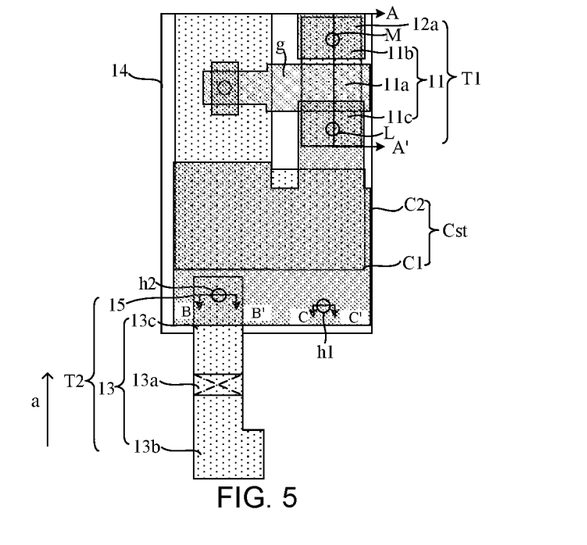
FIG. 5 is a top view of another pixel driving circuit in the related art.
Figure 6:
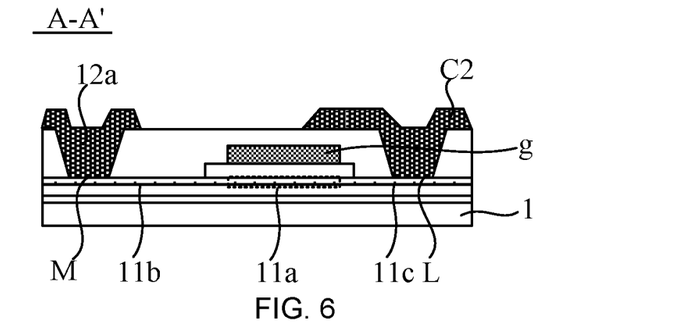
FIG. 6 is a sectional view taken along the A-A' direction in FIG. 4 or 5 in the related art.
Figure 7:
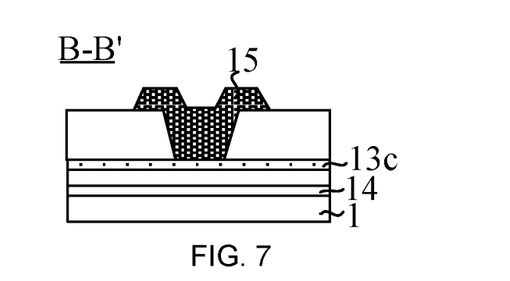
FIG. 7 is a sectional view taken along the B-B' direction in FIG. 4 or 5 in the related art.
Figure 8:
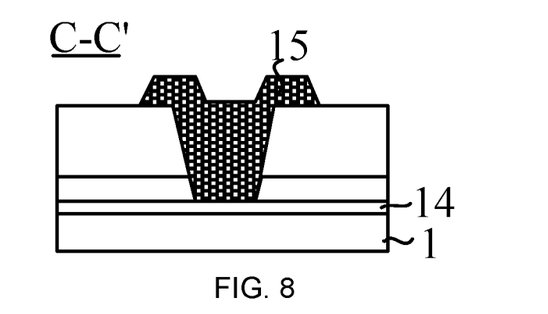
FIG. 8 is a sectional view taken along the C-C' direction in FIG. 4 or 5 in the related art.

In this way, since the second electrode plate C2 is able to shield light, and the orthographic projections, on the base substrate 1, of the edges i of the active portion 11a that are flush with respective edges of the gate g are located within the orthographic projection of the second electrode plate C2 on the base substrate 1, when the light-emitting device 20 emits light under the drive of the pixel driving circuit 10, it is possible to prevent the light emitted from the light-emitting device 20 from being irradiated to the active portion 11a from the edges i (e.g., the upper edge i1 and the lower edge i2 shown in FIG. 2) of the active portion 11a that are flush with respective edges of the gate g, which is able to reduce light interference, thereby improving a stability of a threshold voltage of the driving transistor T1 under NBIS, compared with the related art (as shown in FIGS. 4 and 5) in which an orthographic projection, on a base substrate 1, of part (e.g., a lower edge i2 shown in FIG. 4) of edges of an active portion 11a that are flush with respective edges of a gate g is located within an orthographic projection of a second electrode plate C2 on the base substrate 1.

Based on this, in some embodiments, the light emitted from the light-emitting device 20 exits from a side of the light-emitting device 20 away from the base substrate 1. That is, the display panel is a top-emitting display panel.

Figure 3:
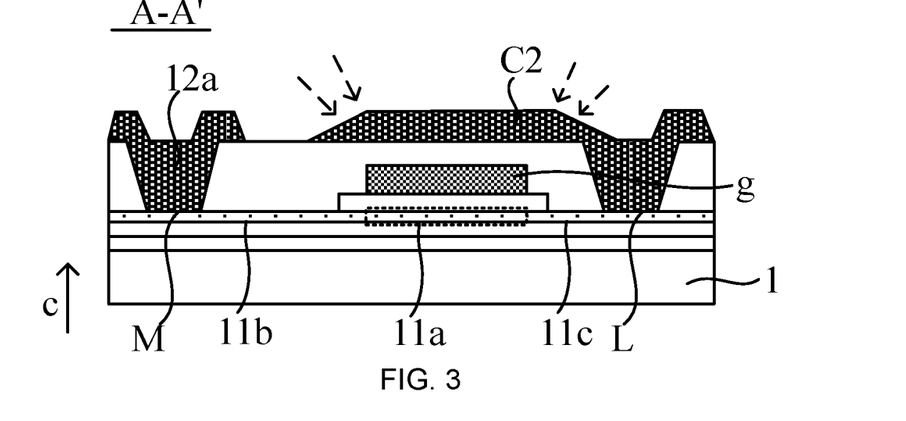
FIG. 3 is a sectional view taken along the A-A' direction in FIG. 2, in accordance with some embodiments.
Figure 9:
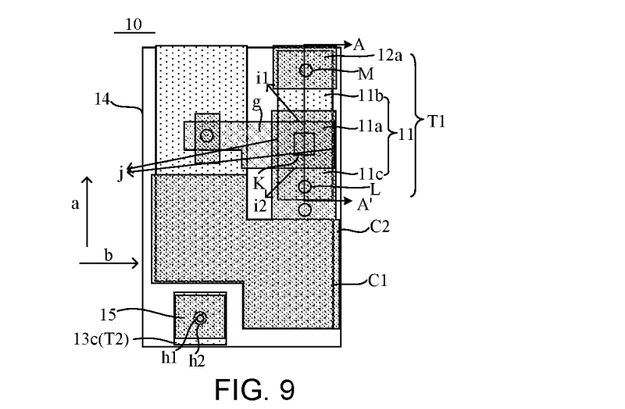
FIG. 9 is a top view of another pixel driving circuit, in accordance with some embodiments.
Figure 10:
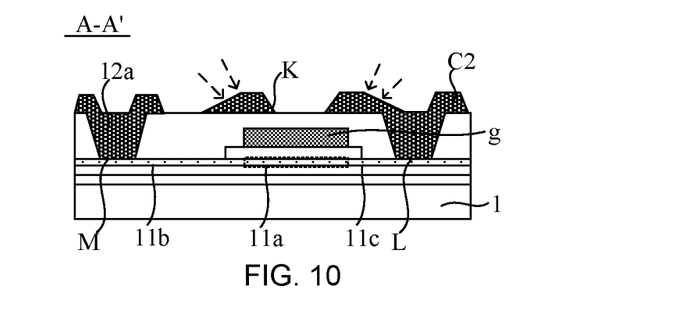
FIG. 10 is a sectional view taken along the A-A' direction in FIG. 9, in accordance with some embodiments.
Figure 11:
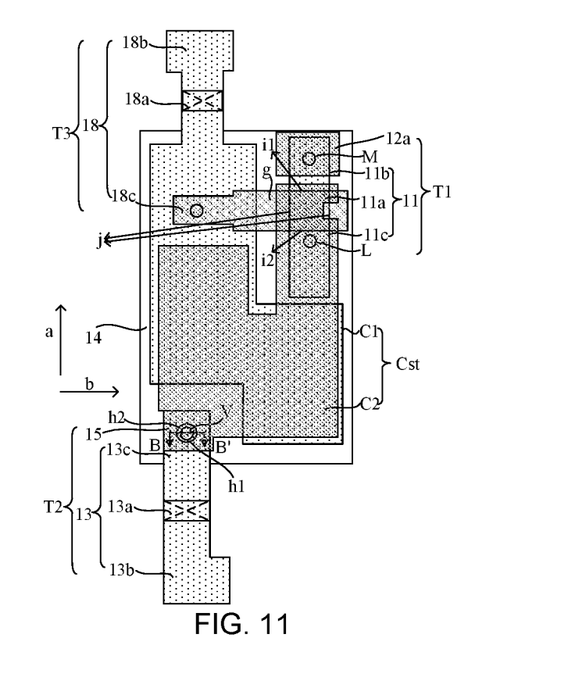
FIG. 11 is a top view of yet another pixel driving circuit, in accordance with some embodiments.

In some embodiments, the orthographic projections, on the base substrate 1, of the edges i of the active portion 11a that are flush with respective edges of the gate g are located within the orthographic projection of the second electrode plate C2 on the base substrate 1, there two possible cases. In a first case, as shown in FIGS. 2 and 3, an orthographic projection of the active portion 11a on the base substrate 1 is located within the orthographic projection of the second electrode plate C2 on the base substrate 1. That is, the orthographic projection of the active portion 11a on the base substrate 1 is overlapped with the orthographic projection of the second electrode plate C2 on the base substrate 1, and orthographic projections of all the edges (including the edges i and the edges j) of the active portion 11a on the base substrate 1 are spaced apart from the orthographic projection of the edge of the second electrode plate C2 on the base substrate 1. In a second case, as shown in FIGS. 9 and 11, an opening K is provided in the second electrode plate C2. The second electrode plate C2 has an inner edge and an outer edge, and an edge of the opening K constitutes the inner edge of the second electrode plate C2. The orthographic projections, on the base substrate 1, of the edges i of the active portion 11a that are flush with respective edges of the gate g are located between an orthographic projection of the outer edge of the second electrode plate C2 on the base substrate 1 and an orthographic projection of the inner edge of the second electrode plate C2 on the base substrate 1. That is, the orthographic projections, on the base substrate 1, of the edges i of the active portion 11a that are flush with respective edges of the gate g are overlapped with the orthographic projection of the second electrode plate C2 on the base substrate 1. Moreover, the orthographic projections, on the base substrate 1, of the edges i of the active portion 11a that are flush with respective edges of the gate g are spaced apart from the orthographic projection of the outer edge of the second electrode plate C2 on the base substrate 1, and are spaced apart from the orthographic projection of the inner edge of the second electrode plate C2 on the base substrate 1.

Here, in some embodiments, the opening K may be closed. That is, as shown in FIG. 9, the edge of the opening K constitutes the inner edge of the second electrode plate C2, and the inner edge of the second electrode plate C2 is spaced apart from and the outer edge of the second electrode plate C2. In some other embodiments, as shown in FIG. 11, the opening K may be a cutout formed in the outer edge of the second electrode plate C2. In this case, part (e.g., an edge j of the edges of the active portion 11a that are flush with respective edges of the active layer 11) of the edges of the active portion 11a is non-covered by the second electrode plate C2.

Here, compared with the first case, in the second case, referring to FIGS. 9 and 11 again, by shielding the light emitted from the light-emitting device 20 and irradiated to the active portion 11a from the edges i of the active portion 11a that are flush with respective edges of the gate g, the active portion 11a is able to be irradiated through the opening K under a condition that the light interference is reduced as much as possible, so as facilitates optical detection of defects of the TFT channel region in a subsequent production line.

In some embodiments, the source portion and the drain portion of the driving transistor T1 serve as a source and a drain of the driving transistor T1, respectively.

In some other embodiments, as shown in FIGS. 2 and 3, the driving transistor T1 may further include a first conductive pattern 12a. The first conductive portion 11b of the driving transistor T1 has a first contact portion M, and the second conductive portion 11c of the first driving transistor T1 has a second contact portion L. The first contact portion M is in contact with the first conductive pattern 12a, and the second contact portion L is in contact with the second electrode plate C2. That is, the first conductive pattern 12a and a portion of the second electrode plate C2 serve as the source and the drain of the driving transistor T1, respectively.

According to the fact that the second electrode plate C2 is disposed on the side of the gate g away from the base substrate 1, it can be known that an insulating layer is provided between the second electrode plate C2 and the second conductive portion 11c. Therefore, the second electrode plate C2 may be in contact with the second conductive portion 11c through a via disposed in the insulating layer. The first conductive pattern 12a may be arranged in a same layer as the second electrode plate C2, or may be arranged in a different layer from the second electrode plate C2. In a case where the first conductive pattern 12a is arranged in the same layer as the second electrode plate C2, the first conductive pattern 12a may be in contact with the first conductive portion 11b through another via disposed in the insulating layer. In a case where the first conductive pattern 12a is arranged in the different layer from the second electrode plate C2, for example, the first conductive pattern 12a may be in direct contact with the first conductive portion 11b. That is, no other layer(s) exist between the first conductive pattern 12a and the first conductive portion 11b.

In some embodiments, as shown in FIGS. 2 and 3, the first conductive pattern 12a is arranged in the same layer as the second electrode plate C2, and the first contact portion M is farther from the active portion 11a than the second contact portion L.

According the fact that in the case where the first conductive pattern 12a is arranged in the same layer as the second electrode plate C2, the first conductive pattern 12a is in contact with the first contact portion M through the another via disposed in the insulating layer, and the second electrode plate C2 is in contact with the second contact portion L through the via disposed in the insulating layer, it can be known that the first contact portion M is farther from the active portion 11a than the second contact portion L, which is conducive to a large gap between the first conductive pattern 12a and the second electrode plate C2, so that the first conductive pattern 12a and the second electrode plate C2 are prevented from being short-circuited.

In some embodiments, as shown in FIGS. 2, 9 and 11, the pixel driving circuit 10 further includes a first switching transistor T2. The first switching transistor T2 includes an active layer 13. The active layer 13 of the first switching transistor T2 includes an active portion 13a, a first conductive portion 13b and a second conductive portion 13c. The first conductive portion 13b of the first switching transistor T2 is used for receiving a reset signal or providing a sensing signal Sense. The reset signal is used for resetting an anode of the light-emitting device, and the sensing signal is used for calculating the threshold voltage of the driving transistor T1. The second conductive portion 13c of the first switching transistor T2 is coupled to the second electrode plate C2.

Figure 13:
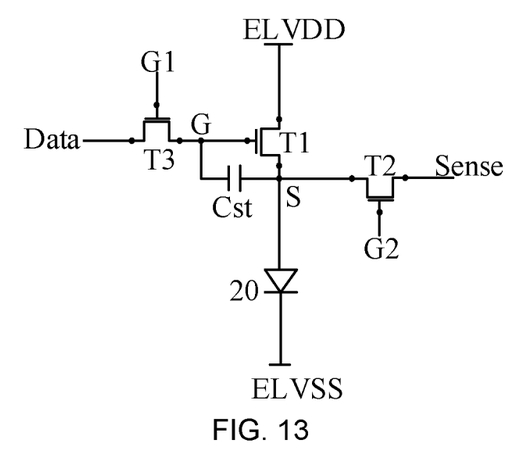
FIG. 13 is an equivalent circuit diagram of a 3T1C type pixel driving circuit, in accordance with some embodiments.

That is, the pixel driving circuit 10 may be the 3T1C type pixel driving circuit. An equivalent circuit diagram of the 3T1C type pixel driving circuit is shown in FIG. 13. In this case, the second conductive portion 13c of the first switching transistor T2, the second electrode plate C2 and the anode of the light-emitting device 20 intersect at a node S. Based on this, parameter(s) of the driving transistor T1 may be sensed by a sensing signal line Sense, so that the threshold voltage may be externally compensated.

In these embodiments, similar to the driving transistor T1, the first conductive portion 13b and the second conductive portion 13c of the first switching transistor T2 may respectively serve as a source and a drain of the first switching transistor T2, and are respectively coupled to the sensing signal line Sense and the second electrode plate C2.

In some embodiments, as shown in FIGS. 2, 9 and 11, the pixel driving circuit 10 further includes a light-shielding metal layer 14 disposed on a side of the active portion 11a of the driving transistor T1 proximate to the base substrate 1. The orthographic projection of the active portion 11a of the driving transistor T1 on the base substrate 1 is located within an orthographic projection of the light-shielding metal layer 14 on the base substrate 1. The light-shielding metal layer 14 is coupled to the second electrode plate C2.

The orthographic projection of the active portion 11a of the driving transistor T1 on the base substrate 1 is located within the orthographic projection of the light-shielding metal layer 14 on the base substrate 1, which means that the orthographic projection of the active portion 11a of the driving transistor T1 on the base substrate 1 is completely located within the orthographic projection of the light-shielding metal layer 14 on the base substrate 1, and the orthographic projections of the edges of the active portion 11a of the driving transistor T1 on the base substrate 1 are spaced apart from an orthographic projection of an edge of the light-shielding metal layer 14 on the base substrate 1.

Figure 14:
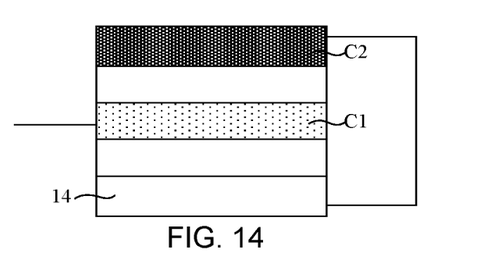
FIG. 14 is a structural diagram of two capacitors connected in parallel, in accordance with some embodiments.

In these embodiments, by providing the light-shielding metal layer 14, light is able to be prevented from being irradiated from a side of the light-shielding metal layer 14 where the base substrate 1 is located to the active portion 11a, so that the light stability of the TFT is able to be further improved, thereby avoiding the drift of the threshold voltage of the driving transistor under NBIS. Moreover, by providing the light-shielding metal layer 14, in a case where the first electrode plate C1 is arranged in a same layer as the active layer 11 of the driving transistor T1, as shown in FIG. 14, the light-shielding metal layer 14 and the first electrode plate C1 are able to constitute another capacitor connected in parallel with the capacitor Cst, so that the storage capacitance of the capacitor Cst in the pixel driving circuit 10 may be increased, thereby further avoiding display unevenness of an image of the display panel.

Figure 12:
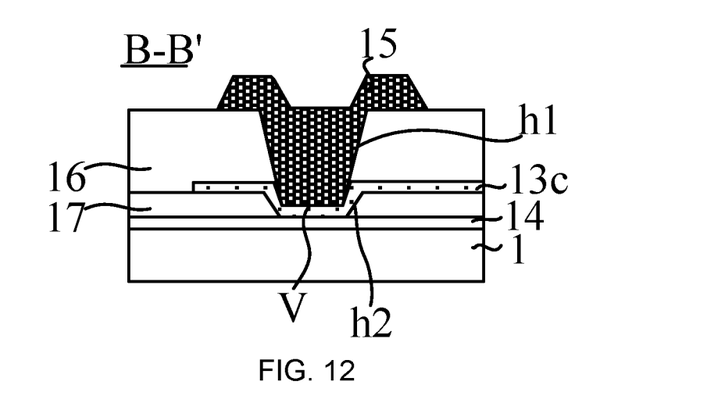
FIG. 12 is a sectional view taken along the B-B' direction in FIG. 11, in accordance with some embodiments.

In some embodiments, as shown in FIGS. 9, 11 and 12, the first switching transistor T2 further includes a second conductive pattern 15. The second conductive portion 13c of the first switching transistor T2 has a third contact portion V, and the third contact portion V is in contact with the second conductive pattern 15. As shown in FIG. 11, the second electrode plate C2 and the second conductive pattern 15 are connected into an integral structure. In this case, the second conductive portion 13c of the first switching transistor T2 may be coupled to the second electrode plate C2 through the second conductive pattern 15. Alternatively, as shown in FIG. 9, the orthographic projection of the second electrode plate C2 on the base substrate 1 is spaced apart from an orthographic projection of the second conductive pattern 15 on the base substrate 1, and the second conductive pattern 15 and the second electrode plate C2 are coupled to the light-shielding metal layer 14, so that the second conductive portion 13c of the first switching transistor T2 is coupled to the second electrode plate C2 through the second conductive pattern 15 and the light-shielding metal layer 14.

In these embodiments, the light-shielding metal layer 14 also serves as an auxiliary electrode, which may improve the connection conductive effect of the second electrode plate C2 and the second conductive portion 13c of the first switching transistor T2.

In some embodiments, as shown in FIGS. 9 and 11, the active layer 13 of the first switching transistor T2 is arranged in the same layer as the active layer 11 of the driving transistor T1, and the second conductive pattern 15 is arranged in the same layer as the second electrode plate C2. The pixel driving circuit 10 further includes a first insulating layer 16 disposed between the active layer 13 of the first switching transistor T2 and the second conductive pattern 15, and a second insulating layer 17 disposed between the active layer 13 of the first switching transistor T2 and the light-shielding metal layer 14. A first via h1 is provided in the first insulating layer 16, and a second via h2 is provided in the second insulating layer 17. An orthogonal projection of the first via h1 on the base substrate 1 is overlapped with an orthogonal projection of the second via h2 on the base substrate 1. The second conductive pattern 15 is coupled to the third contact portion V through the first via h1. The light-shielding metal layer 14 is coupled to the third contact portion V through the second via h2.

Compared with the related art (as shown in FIGS. 4 and 5) in which a first via h1 and a second via h2 each occupy a certain space to enable a second conductive pattern 15 to be coupled to a second conductive portion 13c of the first switching transistor T2 and a light-shielding metal layer 14, in these embodiments, the orthogonal projection of the first via h1 on the base substrate 1 is overlapped with the orthogonal projection of the second via h2 on the base substrate 1, so that the second conductive portion 13c serves as a lapping layer, and the second conductive portion 13c of the first switching transistor T2 is coupled to the light-shielding metal layer 14 and the second conductive pattern 15 through the vias at a same space, thereby saving space.

In some embodiments, as shown in FIGS. 9 and 11, the second conductive pattern 15 is opposite to the second electrode plate C2 in a first direction (indicated by the arrow a in FIG. 9 or 11) and a second direction (indicated by the arrow b in FIG. 9 or 11). The first direction and the second direction are two directions that are parallel to a plane where the base substrate 1 is located and perpendicular to each other.

Compared with the related art (as shown in FIGS. 4 and 5) in which the second conductive pattern 15 is coupled to the light-shielding metal layer 14 through the first via h1, and the second conductive pattern 15 is opposite to the second electrode plate C2 only in a first direction (indicated by the arrow a in FIG. 4 or 5), FIGS. 9 and 11 show examples of a positional relationship between the second conductive pattern 15 and the second electrode plate C2, which may increase an area of the second electrode plate C2. Moreover, in a case where the first electrode plate C1 is arranged in the same layer as the active layer 11, an area of the first electrode plate C1 may also be increased, so that the storage capacitance of the capacitor Cst may be increased.

In some embodiments, as shown in FIGS. 9 and 11, the first electrode plate C1 s arranged in the same layer as the active layer 11, and an orthographic projection of the first electrode plate C1 on the base substrate 1 is overlapped with the orthographic projection of the second electrode plate C2 on the base substrate 1.

In these embodiments, still taking FIG. 9 or 11 as an example, in a case where the second conductive pattern 15 is opposite to the second electrode plate C2 in the second direction, since the orthographic projection of the first electrode plate C1 on the base substrate 1 is overlapped with the orthographic projection of the second electrode plate C2 on the base substrate 1, the storage capacitance of the capacitor Cst may be further increased compared with the related art (as shown in FIG. 4).

In some embodiments, as shown in FIG. 11, the pixel driving circuit further includes a second switching transistor T3. The second switching transistor T3 includes an active layer 18. The active layer 18 of the second switching transistor T3 includes an active portion 18a, a first conductive portion 18b and a second conductive portion 18c.

The first conductive portion 18b of the second switching transistor T3 is used for receiving a data signal. The second conductive portion 18c of the second switching transistor T3 is coupled to the gate g of the driving transistor T1.

In these embodiments, the first conductive portion 18b and the second conductive portion 18c of the second switching transistor T3 may serve as a source and a drain of the second switching transistor T3, respectively.

Referring to the equivalent circuit diagram of the 3T1C type pixel driving circuit shown in FIG. 13, the second conductive portion 18c of the second switching transistor T3 and the gate g of the driving transistor T1 are connected to a node G.

Figure 15:
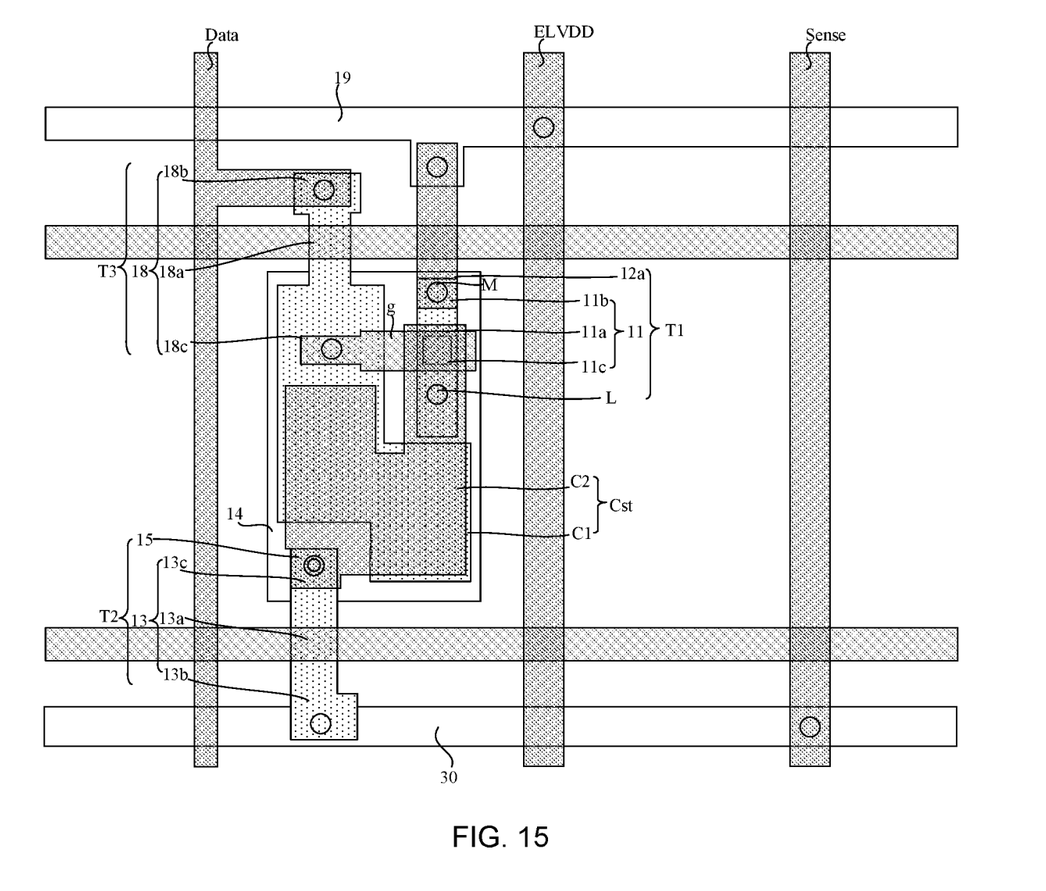
FIG. 15 is a top view of another display panel, in accordance with some embodiments.

In some embodiments, as shown in FIG. 15, the display panel further includes power line(s) ELVDD disposed on the base substrate. The first conductive portion 11b of the driving transistor T1 in the pixel driving circuit is coupled to the power line ELVDD. A first power supply voltage signal ELVDD is written into the driving transistor T1 through the power line ELVDD.

In some embodiments, as shown in FIG. 15, in a case where the driving transistor T1 includes the first conductive pattern 12a, the power line ELVDD may be arranged in a same layer as the first conductive pattern 12a, and may be in contact with the first conductive pattern 12a.

In some embodiments, as shown in FIG. 15, in a case where the pixel driving circuit 10 further includes the light-shielding metal layer 14, the pixel driving circuit 10 further includes a third conductive pattern 19 arranged in a same layer as the light-shielding metal layer 14. The third conductive pattern 19 is coupled to the first conductive portion 11b of the driving transistor T1 and the power line ELVDD. The third conductive pattern 19 may serve as an auxiliary electrode, which is conducive to improving the connection conductive effect of the first conductive portion 11b of the driving transistor T1 and the power line ELVDD.

Here, it will be noted that in the display panel, as shown in FIG. 1, the plurality of sub-pixel regions P may be arranged in an array. Moreover, there may be a plurality of power lines ELVDD. Each power line ELVDD extends in a column direction of the sub-pixel regions P, and at least one column of pixel driving circuits 10 are connected to a power line ELVDD.

In some embodiments, as shown in FIG. 15, the display panel further includes sensing signal line(s) Sense disposed on the base substrate. The first conductive portion 13b of the first switching transistor T2 is coupled to the sensing signal line Sense. In a reset phase, the sensing signal line Sense provides the reset signal to the node S, so as to reset the anode of the light-emitting device 20. In a sensing phase, a signal at the node S is transmitted to the sensing signal line Sense through the first switching transistor T2, and is the sensing signal Sense. The sensing signal is used for calculating the threshold voltage of the driving transistor T1.

In some embodiments, the sensing signal line Sense may be parallel to the power line ELVDD, and may be arranged in the same layer as the power line ELVDD.

In some embodiments, as shown in FIG. 15, the pixel driving circuit 10 further includes a fourth conductive pattern 30 arranged in the same layer as the light-shielding metal layer 14. The fourth conductive pattern 30 is coupled to the first conductive portion 13b of the first switching transistor T2 and the sensing signal line Sense. The fourth conductive pattern 30 may serve as an auxiliary electrode, which is conducive to improving the connection conductive effect of the first conductive portion 13b of the first switching transistor T2 and the sensing signal line Sense.

In some embodiments, as shown in FIG. 15, the display panel may further include data line(s) Data disposed on the base substrate 1. The first conductive portion 18b of the second switching transistor T3 is coupled to the data line Data. A data signal is written into the second switching transistor T3 through the data line Data.

In some embodiments, the data line Data, the sensing signal line Sense and the power line ELVDD may be arranged in the same layer as the second electrode plate C2.

Materials of the data line Data, the sensing signal line Sense, the power line ELVDD and the second electrode plate C2 each may be selected from elemental metals of copper (Cu), aluminum (Al), molybdenum (Mo), titanium (Ti), chromium (Cr) and tungsten (W), and metal alloys composed of these elemental metals.

Based on the above, an operating process of the pixel driving circuit will be described below with reference to FIGS. 13 and 15.

As shown in FIGS. 13 and 15, a first gate signal terminal G1 is configured to receive a first gate signal G1. A second gate signal terminal G2 is configured to receive a second gate signal G2. The data line Data is configured to receive the data signals Data, and the data signals Data include, for example, a sensing data signal $Data_1$ and a display data signal $Data_2$. The power line ELVDD is configured to receive the first power supply voltage signal ELVDD, and the first power supply voltage signal ELVDD is, for example, in a range from −5 V to 5 V. A power supply voltage signal terminal ELVSS is configured to receive a second power supply voltage signal ELVSS, and the second power supply voltage signal ELVSS is, for example, a constant voltage signal, such as a voltage signal less than or equal to 0 V. The sensing signal line Sense is configured to provide the reset signal or obtain the sensing signal Sense. The reset signal is used for resetting the anode of the light-emitting device 20, and the sensing signal is used for calculating the threshold voltage of the driving transistor T1.

When the pixel driving circuit operates in a blanking period of an image frame, the operating process of the pixel driving circuit is, for example, as follows. Under a control of a first gate signal $G1_1$ provided from the first gate signal terminal G1, the second switching transistor T3 is turned on to transmit the sensing data signal $Data_1$ to the node G through the data line Data. Under a control of a second gate signal $G2_1$ provided from the second gate signal terminal G2, the first switching transistor T2 is turned on to transmit the signal at the node S to the sensing signal line Sense through the first switching transistor T2. When the sensing data signal $Data_1$ and the power supply voltage signal ELVDD enable the node G to control the second switching transistor T3 to be turned off, a magnitude of the sensing signal Sense of the sensing signal line Sense is measured, and the threshold voltage $V_{th}$ of the driving transistor T1 may be calculated according to a difference between the sensing data signal $Data_1$ and the sensing signal Sense.

In the above process, the sensing signal Sense is measured by controlling the first switching transistor, so that the threshold voltage of the driving transistor is calculated. The threshold voltage of the driving transistor is calculated and then compensated into the display data signal $Data_2$, thereby completing an external compensation of the pixel driving circuit. Referring to FIG. 13, during the external compensation, the pixel driving circuit needs to receive the first gate signal $G1_1$ and the second gate signal $G2_1$ to turn on the first switching transistor T2 and the second switching transistor T3. At this time, a sensing signal terminal Sense is in a floating state, which is equivalent to a capacitor. After the sensing data signal $Data_1$ controls the driving transistor T1 to be turned on, the first power supply voltage signal ELVDD is transmitted to the node S, so as to charge the node S until a potential of the node S is unchanged. At this time, a difference between a potential of the node G and the potential of the node S is equal to the threshold voltage of the driving transistor T1. The first switching transistor T2 is in an on state, so that the signal at the node S is transmitted to the sensing signal terminal Sense through the first switching transistor T2, and is the sensing signal Sense. At this time, the magnitude of the sensing signal Sense is equal to the potential of the node S, so that the threshold voltage of the driving transistor T1 may be calculated by calculating the difference between the sensing data signal $Data_1$ and the sensing signal Sense.

When the pixel driving circuit operates in a display period of the image frame, the operating process of the pixel driving circuit includes, for example, the reset phase, a data writing phase, and a light-emitting phase.

In the reset phase, under a control of a second gate signal $G2_2$ provided from the second gate signal terminal G2, the first switching transistor T2 is turned on to transmit the reset signal provided from the sensing signal terminal Sense to the node S, so as to reset the anode of the light-emitting device 20.

In the data writing phase, under a control of a first gate signal $G1_2$ provided from the first gate signal terminal G1, the second switching transistor T3 is turned on to transmit the display data signal $Data_2$ provided from the data line Data to the node G, so as to charge the capacitor Cst.

In the light-emitting phase, the driving transistor T1 is turned on under a control of the node G, and the capacitor Cst starts discharging to the node G, so that the potential of the node G is maintained for a period of time, thereby ensuring an on-time of the driving transistor T1. After being turned on, the driving transistor T1 outputs a driving signal to the light-emitting device 20 under a control of the first power supply voltage signal ELVDD provided from the power line ELVDD and a voltage of the gate. The driving signal is, for example, a driving current. The light-emitting device 20 starts emitting light under a control of the driving signal.

In the operating process of the pixel driving circuit in the image frame, the gate signals received by the first gate signal terminal G1 and the second gate signal terminal G2 are provided by the gate driving circuit.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
   a base substrate; and
   pixel driving circuits disposed on the base substrate, a pixel driving circuit in the pixel driving circuits including a driving transistor, a capacitor, a light-shielding metal layer, a first switching transistor, a second conductive pattern, a first insulating layer and a second insulating layer; wherein
   the driving transistor includes a gate and an active layer, and the active layer of the driving transistor includes an active portion, a first conductive portion and a second conductive portion; the gate is farther from the base substrate than the active layer of the driving transistor; and the active portion of the driving transistor includes edges that are flush with respective edges of the gate;
   the capacitor includes a first electrode plate and a second electrode plate arranged opposite to each other in a thickness direction of the base substrate; the first electrode plate is coupled to the gate of the driving transistor; the second electrode plate is disposed on a side of the gate away from the base substrate, and is able to shield light; and orthographic projections, on the base substrate, of the edges of the active portion of the driving transistor that are flush with the respective edges of the gate are located within an orthographic projection of the second electrode plate on the base substrate;

the light-shielding metal layer is disposed on a side of the active layer of the driving transistor proximate to the base substrate; and an orthographic projection of the active portion of the driving transistor on the base substrate is located within an orthographic projection of the light-shielding metal layer on the base substrate, and the light-shielding metal layer is coupled to the second electrode plate;

the first switching transistor includes an active layer including an active portion, a first conductive portion and a second conductive portion; the first conductive portion of the first switching transistor is used for receiving a reset signal or providing a sensing signal, and the second conductive portion of the first switching transistor is coupled to the second electrode plate; the second conductive portion of the first switching transistor has a third contact portion, and the third contact portion is in contact with the second conductive pattern; and the active layer of the first switching transistor is arranged in a same layer as the active layer of the driving transistor, and the second conductive pattern is arranged in a same layer as the second electrode plate; and the first insulating layer is disposed between the active layer of the first switching transistor and the second conductive pattern, and the second insulating layer is disposed between the active layer of the first switching transistor and the light-shielding metal layer, wherein a first via is provided in the first insulating layer, and a second via is provided in the second insulating layer; an orthogonal projection of the first via on the base substrate is overlapped with an orthogonal projection of the second via on the base substrate; and the second conductive pattern is in contact with the third contact portion through the first via, and the light-shielding metal layer is coupled to the third contact portion through the second via.

2. The display panel according to claim 1, wherein the orthographic projection of the active portion of the driving transistor on the base substrate is located within the orthographic projection of the second electrode plate on the base substrate.

3. The display panel according to claim 1, wherein the driving transistor further includes a first conductive pattern; and the first conductive portion of the driving transistor has a first contact portion, and the second conductive portion of the driving transistor has a second contact portion; and the first contact portion is in contact with the first conductive pattern, and the second contact portion is in contact with the second electrode plate.

4. The display panel according to claim 3, wherein the first conductive pattern is arranged in a same layer as the second electrode plate; and the first contact portion is farther from the active portion of the driving transistor than the second contact portion.

5. The display panel according to claim 1, wherein the second electrode plate and the second conductive pattern are connected into an integral structure; or the orthographic projection of the second electrode plate on the base substrate is spaced apart from an orthographic projection of the second conductive pattern on the base substrate, and the second conductive pattern and the second electrode plate are coupled to the light-shielding metal layer.

6. The display panel according to claim 5, wherein the second conductive pattern is opposite to the second electrode plate in a first direction and a second direction; and the first direction and the second direction are two directions that are parallel to a plane where the base substrate is located and perpendicular to each other.

7. The display panel according to claim 1, wherein the first electrode plate is arranged in a same layer as the active layer of the driving transistor; and an orthographic projection of the first electrode plate on the base substrate is overlapped with the orthographic projection of the second electrode plate on the base substrate.

8. The display panel according to claim 1, wherein the pixel driving circuit further includes a second switching transistor; wherein the second switching transistor includes an active layer, and the active layer of the second switching transistor includes an active portion, a first conductive portion and a second conductive portion; and the first conductive portion of the second switching transistor is used for receiving a data signal, and the second conductive portion of the second switching transistor is coupled to the gate of the driving transistor.

9. The display panel according to claim 8, further comprising a data line disposed on the base substrate; wherein the first conductive portion of the second switching transistor is coupled to the data line.

10. The display panel according to claim 1, further comprising a power line disposed on the base substrate; wherein the first conductive portion of the driving transistor in the pixel driving circuit is coupled to the power line.

11. The display panel according to claim 10, wherein the driving transistor further includes a first conductive pattern; the first conductive portion of the driving transistor has a first contact portion, and the second conductive portion of the driving transistor has a second contact portion; the first contact portion is in contact with the first conductive pattern, and the second contact portion is in contact with the second electrode plate;

and the power line is arranged in a same layer as the first conductive pattern, and the power line is in contact with the first conductive pattern.

12. The display panel according to claim 10, wherein the pixel driving circuit further includes a third conductive pattern arranged in a same layer as the light-shielding metal layer, and the third conductive pattern is coupled to the first conductive portion of the driving transistor and the power line.

13. The display panel according to claim 1, further comprising a sensing signal line disposed on the base substrate; wherein the first conductive portion of the first switching transistor is coupled to the sensing signal line.

14. The display panel according to claim 13, wherein the pixel driving circuit further includes a fourth conductive pattern arranged in a same layer as the light-shielding metal layer, and the fourth conductive pattern is coupled to the first conductive portion of the first switching transistor and the sensing signal line.

15. The display panel according to claim 1, further comprising light-emitting devices disposed on the base substrate and respectively coupled to the pixel driving circuits; wherein
- light emitted from the light-emitting devices exits from a side of the light-emitting devices away from the base substrate.

16. A display apparatus, comprising the display panel according to claim 1.

17. The display panel according to claim 1, wherein
- an opening is provided in the second electrode plate; the second electrode plate has an inner edge and an outer edge, and an edge of the opening constitutes the inner edge of the second electrode plate; and the orthographic projections, on the base substrate, of the edges of the active portion of the driving transistor that are flush with the respective edges of the gate are located between an orthographic projection of the outer edge of the second electrode plate on the base substrate and an orthographic projection of the inner edge of the second electrode plate on the base substrate.

* * * * *